(12) United States Patent
Melanson

(10) Patent No.: US 7,804,697 B2
(45) Date of Patent: Sep. 28, 2010

(54) HISTORY-INDEPENDENT NOISE-IMMUNE MODULATED TRANSFORMER-COUPLED GATE CONTROL SIGNALING METHOD AND APPARATUS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 299 days.

(21) Appl. No.: 12/164,217

(22) Filed: Jun. 30, 2008

(65) Prior Publication Data
US 2009/0147545 A1 Jun. 11, 2009

Related U.S. Application Data

(63) Continuation-in-part of application No. 11/954,202, filed on Dec. 11, 2007, now Pat. No. 7,656,687.

(51) Int. Cl.
*H02M 3/335* (2006.01)
*H02M 5/40* (2006.01)

(52) U.S. Cl. ............... 363/34; 363/20; 363/15; 363/21.01

(58) Field of Classification Search ............ 363/34, 363/20, 15, 16, 21.01, 95, 97
See application file for complete search history.

(56) References Cited

U.S. PATENT DOCUMENTS

| | | |
|---|---|---|
| 3,790,878 A | 2/1974 | Brokaw |
| 3,881,167 A | 4/1975 | Pelton et al. |
| 4,075,701 A | 2/1978 | Hofmann |

(Continued)

FOREIGN PATENT DOCUMENTS

EP 1014563 6/2000

(Continued)

OTHER PUBLICATIONS

"AN-H52 Application Note: HV9931 Unity Power Factor LED Lamp Driver" Mar. 7, 2007, Supertex Inc., Sunnyvale, CA, USA.

(Continued)

*Primary Examiner*—Bao Q Vu
(74) *Attorney, Agent, or Firm*—Andrew M. Harris; Mitch Harris, Atty at Law, LLC

(57) ABSTRACT

A history-independent and noise-immune modulated transformer-coupled gate control signaling method and apparatus provides robust design characteristics in switching power circuits having a transformer-coupled gate drive. A modulated control signal at a rate substantially higher than the switching circuit gate control rate is provided from the controller circuit to a demodulator via transformer coupling. Codes specified by relative timing of transitions in multiple periods of the modulated control are assigned to gate-on and gate-off timing events that control the switching transistor gate(s) and unassigned patterns are decoded as gate-off events, reducing the possibility that a switching transistor will be erroneously activated due to noise. The modulated signal is constructed so that signal history is not required for decoding, eliminating any requirement of a reference clock. Blanking may be employed to conserve power between codes and to avoid mis-triggering due to noise events during power switching.

26 Claims, 7 Drawing Sheets

U.S. PATENT DOCUMENTS

| | | | |
|---|---|---|---|
| 4,334,250 A | 6/1982 | Theus | |
| 4,414,493 A | 11/1983 | Henrich | |
| 4,476,706 A | 10/1984 | Hadden et al. | |
| 4,677,366 A | 6/1987 | Wilkinson et al. | |
| 4,683,529 A | 7/1987 | Bucher | |
| 4,697,210 A | 9/1987 | Toyota et al. | |
| 4,700,188 A | 10/1987 | James | |
| 4,737,658 A | 4/1988 | Kronmuller et al. | |
| 4,797,633 A | 1/1989 | Humphrey | |
| 4,940,929 A | 7/1990 | Williams | |
| 4,973,919 A | 11/1990 | Allfather | |
| 4,979,087 A | 12/1990 | Sellwood et al. | |
| 4,992,919 A | 2/1991 | Lee et al. | |
| 4,994,952 A | 2/1991 | Silva et al. | |
| 5,206,540 A | 4/1993 | da Sa e Silva et al. | |
| 5,278,490 A | 1/1994 | Smedley | |
| 5,323,157 A | 6/1994 | Ledzius et al. | |
| 5,359,180 A | 10/1994 | Park et al. | |
| 5,383,109 A | 1/1995 | Maksimovic et al. | |
| 5,477,481 A | 12/1995 | Kerth | |
| 5,481,178 A | 1/1996 | Wilcox et al. | |
| 5,565,761 A | 10/1996 | Hwang | |
| 5,638,265 A | 6/1997 | Gabor | |
| 5,691,890 A | 11/1997 | Hyde | |
| 5,747,977 A | 5/1998 | Hwang | |
| 5,781,040 A | 7/1998 | Myers | |
| 5,783,909 A | 7/1998 | Hochstein | |
| 5,834,858 A | 11/1998 | Crosman, III et al. | |
| 5,900,683 A | 5/1999 | Rinehart et al. | |
| 5,929,400 A | 7/1999 | Colby et al. | |
| 5,946,202 A | 8/1999 | Balogh | |
| 5,952,849 A | 9/1999 | Haigh et al. | |
| 5,963,086 A | 10/1999 | Hall | |
| 5,966,297 A | 10/1999 | Minegishi | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,211,626 B1 | 4/2001 | Lys et al. | |
| 6,211,627 B1 | 4/2001 | Callahan | |
| 6,229,271 B1 | 5/2001 | Liu | |
| 6,246,183 B1 | 6/2001 | Buonavita | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,344,811 B1 | 2/2002 | Melanson | |
| 6,385,063 B1 | 5/2002 | Sadek et al. | |
| 6,407,691 B1 | 6/2002 | Yu | |
| 6,441,558 B1 | 8/2002 | Muthu et al. | |
| 6,445,600 B2 | 9/2002 | Ben-Yaakov | |
| 6,452,521 B1 | 9/2002 | Wang | |
| 6,495,964 B1 | 12/2002 | Muthu et al. | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,636,003 B2 | 10/2003 | Rahm et al. | |
| 6,713,974 B2 | 3/2004 | Patchornik et al. | |
| 6,727,832 B1 | 4/2004 | Melanson | |
| 6,741,123 B1 | 5/2004 | Anderson et al. | |
| 6,753,661 B2 | 6/2004 | Muthu et al. | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,873,065 B2 | 3/2005 | Haigh et al. | |
| 6,882,552 B2 | 4/2005 | Telefus et al. | |
| 6,888,322 B2 | 5/2005 | Dowling et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,958,920 B2 | 10/2005 | Mednik et al. | |
| 6,967,448 B2 | 11/2005 | Morgan et al. | |
| 6,970,503 B1 | 11/2005 | Kalb | |
| 6,975,079 B2 | 12/2005 | Lys et al. | |
| 7,003,023 B2 | 2/2006 | Krone et al. | |
| 7,050,509 B2 | 5/2006 | Krone et al. | |
| 7,064,498 B2 | 6/2006 | Dowling et al. | |
| 7,064,531 B1 | 6/2006 | Zinn | |
| 7,075,329 B2 | 7/2006 | Chen et al. | |
| 7,078,963 B1 | 7/2006 | Andersen et al. | |
| 7,088,059 B2 | 8/2006 | McKinney et al. | |
| 7,102,902 B1 | 9/2006 | Brown et al. | |
| 7,106,603 B1 | 9/2006 | Lin et al. | |
| 7,109,791 B1 | 9/2006 | Epperson et al. | |
| 7,135,824 B2 | 11/2006 | Lys et al. | |
| 7,145,295 B1 | 12/2006 | Lee et al. | |
| 7,158,573 B2 | 1/2007 | Hershbarger | |
| 7,158,633 B1 | 1/2007 | Hein | |
| 7,161,816 B2 | 1/2007 | Shytenberg et al. | |
| 7,183,957 B1 | 2/2007 | Melanson | |
| 7,212,640 B2 | 5/2007 | Bizjak | |
| 7,221,130 B2 | 5/2007 | Ribeiro et al. | |
| 7,233,135 B2 | 6/2007 | Noma et al. | |
| 7,255,457 B2 | 8/2007 | Ducharm et al. | |
| 7,266,001 B1 | 9/2007 | Notohamiprodjo et al. | |
| 7,272,585 B2 | 9/2007 | Nomura et al. | |
| 7,288,902 B1 | 10/2007 | Melanson | |
| 7,289,054 B1 | 10/2007 | Watanabe | |
| 7,292,013 B1 | 11/2007 | Chen et al. | |
| 7,310,244 B2 | 12/2007 | Yang et al. | |
| 7,331,226 B2 | 2/2008 | Feldman et al. | |
| 7,382,635 B2 | 6/2008 | Noda | |
| 7,538,499 B2 | 5/2009 | Ashdown | |
| 7,545,130 B2 | 6/2009 | Latham | |
| 7,554,473 B2 | 6/2009 | Melanson | |
| 7,569,996 B2 | 8/2009 | Holmes et al. | |
| 7,656,103 B2 | 2/2010 | Shteynberg et al. | |
| 7,656,687 B2 | 2/2010 | Melanson | |
| 2002/0145041 A1 | 10/2002 | Muthu et al. | |
| 2002/0150151 A1 | 10/2002 | Krone et al. | |
| 2002/0166073 A1 | 11/2002 | Nguyen et al. | |
| 2003/0095013 A1 | 5/2003 | Melanson et al. | |
| 2003/0223255 A1 | 12/2003 | Ben-Yaakov | |
| 2004/0046683 A1 | 3/2004 | Mitamura et al. | |
| 2004/0085030 A1 | 5/2004 | Laflamme et al. | |
| 2004/0085117 A1 | 5/2004 | Melbert et al. | |
| 2004/0169477 A1 | 9/2004 | Yancie et al. | |
| 2004/0227571 A1 | 11/2004 | Kuribayashi | |
| 2004/0228116 A1 | 11/2004 | Miller et al. | |
| 2004/0232971 A1 | 11/2004 | Kawasaki et al. | |
| 2004/0239262 A1 | 12/2004 | Ido et al. | |
| 2005/0057237 A1 | 3/2005 | Clavel | |
| 2005/0156770 A1 | 7/2005 | Melanson | |
| 2005/0184895 A1 | 8/2005 | Petersen et al. | |
| 2005/0207190 A1 | 9/2005 | Gritter | |
| 2005/0253533 A1 | 11/2005 | Lys et al. | |
| 2005/0270813 A1 | 12/2005 | Zhang et al. | |
| 2005/0275354 A1 | 12/2005 | Hausman, Jr. et al. | |
| 2005/0275386 A1 | 12/2005 | Jepsen et al. | |
| 2006/0022916 A1 | 2/2006 | Aiello | |
| 2006/0023002 A1 | 2/2006 | Hara et al. | |
| 2006/0125420 A1 | 6/2006 | Boone et al. | |
| 2006/0226795 A1 | 10/2006 | Walter et al. | |
| 2006/0261754 A1 | 11/2006 | Lee | |
| 2007/0029946 A1 | 2/2007 | Yu et al. | |

| | | | |
|---|---|---|---|
| 2007/0040512 A1 | 2/2007 | Jungwirth et al. | |
| 2007/0053182 A1 | 3/2007 | Robertson | |
| 2007/0103949 A1 | 5/2007 | Tsuruya | |
| 2007/0182699 A1 | 8/2007 | Ha et al. | |
| 2007/0231009 A1 | 10/2007 | Watahiki | |
| 2008/0174372 A1 | 7/2008 | Tucker et al. | |
| 2008/0192509 A1 | 8/2008 | Dhuyvetter et al. | |
| 2008/0224635 A1 | 9/2008 | Hayes | |
| 2008/0259655 A1 | 10/2008 | Wei et al. | |
| 2008/0278132 A1 | 11/2008 | Kesterson et al. | |
| 2009/0147544 A1 | 6/2009 | Melanson | |
| 2009/0190384 A1 | 7/2009 | Thompson | |
| 2009/0191837 A1 | 7/2009 | Nanda et al. | |
| 2009/0212759 A1 | 8/2009 | Melanson | |
| 2009/0218960 A1 | 9/2009 | Lyons et al. | |

FOREIGN PATENT DOCUMENTS

| | | |
|---|---|---|
| EP | 1164819 | 12/2001 |
| EP | 1213823 | 6/2002 |
| EP | 1528785 | 5/2005 |
| EP | 1768257 | 3/2007 |
| EP | 1768257 A1 | 3/2007 |
| GB | 2262673 | 6/1993 |
| GB | 2262673 A | 6/1993 |
| WO | WO91/13417 | 9/1991 |
| WO | WO97/42714 | 11/1997 |
| WO | WO 01/84697 | 11/2001 |
| WO | WO 01/97384 | 12/2001 |
| WO | WO 02/27944 | 4/2002 |
| WO | WO 02/091805 | 11/2002 |
| WO | WO 2006/067521 | 6/2006 |
| WO | WO 2006/135584 | 12/2006 |
| WO | WO 2007/026170 | 3/2007 |
| WO | WO 2007/079362 | 7/2007 |

OTHER PUBLICATIONS

"HV9931 Unity Power Factor LED Lamp Driver, Initial Release", Supertex Inc., Sunnyvale, CA USA 2005.

A. Prodic, Compensator Design and Stability Assessment for Fast Voltage Loops of Power Factor Correction Rectifiers, IEEE Transactions on Power Electronics, vol. 22, No. 5, Sep. 2007.

A. R. Seidel, et al., A Practical Comparison Among High-Power-Factor Electronic Ballasts with Similar Ideas, IEEE Transactions on Industry Applications, vol. 41, No. 6, Nov.-Dec. 2005.

A. Silva De Morais, et al., A High Power Factor Ballast Using a Single Switch with Both Power Stages Integrated, IEEE Transactions on Power Electronics, vol. 21, No. 2, Mar. 2006.

Abramovitz, et al., "A Resonant DC-DC Transformer With Zero Current Ripple", IEEE Transactions on Power Electronics, Nov. 2007, p. 2344-2351, vol. 22, No. 6.

AD7400 Datasheet, "Isolated Sigma-Delta Modulator", Analog Devices 2006.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Analog Devices, "120 kHz Bandwidth, Low Distortion, Isolation Amplifier", AD215, Norwood, MA, 1996.

Analog Devices, "Isolated Sigma-Delta Modulator", AD7400, Analog Devices, Norwood, MA, 2006.

Azoteq, IQS17 Family, IQ Switch®—ProxSense™ Series, Touch Sensor, Load Control and User Interface, IQS17 Datasheet V2.00. doc, Jan. 2007.

B.A. Miwa, et al., High Efficiency Power Factor Correction Using Interleaved Techniques, Applied Power Electronics Conference and Exposition, Seventh Annual Conference Proceedings, Feb. 23-27, 1992.

Barragan, et al., "Efficiency Optimization in ZVS Series Resonant Inverters With Asymmetrical Voltage-Cancellation Control", IEEE Transactions on Power Electronics, Sep. 2005, p. 1036-1044, vol. 20, No. 5.

BB3656 Datasheet "Transformer Coupled Isolation Amplifier", Burr-Brown 1987.

Ben-Yaakov, et al., "The Dynamics of a PWM Boost Converter with Resistive Input" IEEE Transactions on Industrial Electronics, IEEE Service Center, Piscataway, NJ, USA, vol. 46, No. 3, Jun. 1, 1999.

Bhat, et al., "Analysis and Design of a High-Frequency Resonant Converter Using LCC-Type Commutation", IEEE Transactions on Power Electronics, Oct. 1987, p. 291-301, vol. PE-2 No. 4.

Burr-Brown, "Transformer Coupled Isolation Amplifier", BB3656 Datasheet, Tucson, AZ, 1987.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

C. Dilouie, Introducing the LED Driver, EC&M, Sep. 2004.

C. M. De Oliviera Stein, et al., A ZCT Auxiliary Communication Circuit for Interleaved Boost Converters Operating in Critical Conduction Mode, IEEE Transactions on Power Electronics, vol. 17, No. 6, Nov. 2002.

Chen, et al., "Generalized Optimal Trajectory Control for Closed Loop Control of Series-Parallel Resonant Converter", IEEE Transactions on Power Electronics, Sep. 2006, p. 1347-1355, vol. 21, No. 5.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

Color Temperature, www.sizes.com/units/color_temperature.htm, printed Mar. 27, 2007.

D. Hausman, Lutron, RTISS-TE Operation, Real-Time Illumination Stability Systems for Trailing-Edge (Reverse Phase Control) Dimmers, v. 1.0 Dec. 2004.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

D. Maksimovic, et al., "Switching Converters with Wide DC Conversion Range," Institute of Electrical and Electronic Engineer's (IEEE) Transactions on Power Electronics, Jan. 1991.

D. Rand, et al., Issues, Models and Solutions for Triac Modulated Phase Dimming of LED Lamps, Power Electronics Specialists Conference, 2007.

D.K.W. Cheng, et al., A New Improved Boost Converter with Ripple Free Input Current Using Coupled Inductors, Power Electronics and Variable Speed Drives, Sep. 21-23, 1998.

Dallas Semiconductor, Maxim, "Charge-Pump and Step-Up DC-DC Converter Solutions for Powering White LEDs in Series or Parallel Connections," Apr. 23, 2002.

Data Sheet LT3496 Triple Output LED Driver, Linear Technology Corporation, Milpitas, CA 2007.

De Groot, et al., "Design of a 1-MHz LLC Resonant Converter Based on a DSP-Driven SOI Half-Bridge Power MOS Module", IEEE Transactions on Power Electronics, Nov. 2007, p. 2307-2320, vol. 22 No. 4.

Doyle et al., Feedback Control Theory, Macmillan Publishing Co., 1990.

Dustin Rand, et al., "Issues, Models and Solutions for Triac Modulated Phase Dimming of LED Lamps" Power Electronics Specialists Conference, 2007. PESC 2007. IEEE, IEEE, P1, Jun. 1, 2007, pp. 1398-1404.

Erickson, Robert W., et al., "Fundamentals of Power Electronics," Second Edition, Chapter 6, Boulder, CO, 2001.

F. T. Wakabayashi, et al., An Improved Design Procedure for LCC Resonant Filter of Dimmable Electronic Ballasts for Fluorescent Lamps, Based on Lamp Model, IEEE Transactions on Power Electronics, vol. 20, No. 5, Sep. 2005.

F. Tao, et al., "Single-Stage Power-Factor-Correction Electronic Ballast with a Wide Continuous Dimming Control for Fluorescent Lamps," IEEE Power Electronics Specialists Conference, vol. 2, 2001.

Fairchild Semiconductor, Application Note 42030, Theory and Application of the ML4821 Average Current Mode PFC Controller, Oct. 25, 2000.

Fairchild Semiconductor, Application Note 42030, Theory and Application of the ML4821 Average Current Mode PFC Controller, Aug. 1997.
Fairchild Semiconductor, Application Note 42047 Power Factor Correction (PFC) Basics, Rev. 0.9.0 Aug. 19, 2004.
Fairchild Semiconductor, Application Note 6004, 500W Power-Factor-Corrected (PFC) Converter Design with FAN4810, Rev. 1.0.1, Oct. 31, 2003.
Fairchild Semiconductor, Application Note AN4121, Design of Power Factor Correction Circuit Using FAN7527B, Rev.1.0.1, May 30, 2002.
Fairchild Semiconductor, FAN4800, Low Start-up Current PFC/PWM Controller Combos, Nov. 2006.
Fairchild Semiconductor, FAN4810, Power Factor Correction Controller, Sep. 24, 2003.
Fairchild Semiconductor, FAN4822, ZVA Average Current PFC Controller, Rev. 1.0.1 Aug. 10, 2001.
Fairchild Semiconductor, FAN4822, ZVS Average Current PFC Controller, Aug. 10, 2001.
Fairchild Semiconductor, FAN7527B, Power Factor Correction Controller, 2003.
Fairchild Semiconductor, FAN7532, Ballast Controller, Rev. 1.0.2, Jun. 2006.
Fairchild Semiconductor, FAN7544, Simple Ballast Controller, Rev. 1.0.0, 2004.
Fairchild Semiconductor, FAN7711, Ballast Control IC, Rev. 1.0.2, Mar. 2007.
Fairchild Semiconductor, KA7541, Simple Ballast Controller, Rev. 1.0.3, 2001.
Fairchild Semiconductor, ML4812, Power Factor Controller, Rev. 1.0.4, May 31, 2001.
Fairchild Semiconductor, ML4821, Power Factor Controller, Jun. 19, 2001.
Fairchild Semiconductor, ML4821, Power Factor Controller, Rev. 1.0.2, Jun. 19, 2001.
Feng, et al., "Ultra Fast Fixed-Frequency Hysteretic Buck Converter With Maximum Charging Current Control and Adaptive Delay Compensation for DVS Applications", IEEE JSSC, IEEE Press, New Jersey, Nov. 2001.
Foster, et al., "Cyclic-Averaging for High Speed Analysis of Resonant Converters", IEEE Transactions on Power Electronics, Jul. 2003, p. 985-993, vol. 18, No. 4.
Freescale Semiconductor, AN1965, Design of Indirect Power Factor Correction Using 56F800/E, Jul. 2005.
Freescale Semiconductor, AN3052, Implementing PFC Average Current Mode Control Using the MC9S12E128, Nov. 2005.
Freescale Semiconductor, Inc., Dimmable Light Ballast with Power Factor Correction, Design Reference Manual, DRM067, Rev. 1, Dec. 2005.
G. Yao, et al., Soft Switching Circuit for Interleaved Boost Converters, IEEE Transactions on Power Electronics, vol. 22, No. 1, Jan. 2007.
Gu, et al., "Three-Level LLC Series Resonant DC/DC Converter," IEEE Transactions on Power Electronics, vol. 20, No. 4, p. 781-789, Jul. 2005.
H. L. Cheng, et al., A Novel Single-Stage High-Power-Factor Electronic Ballast with Symmetrical Topology, IEEE Transactions on Power Electronics, vol. 50, No. 4, Aug. 2003.
H. Peng, et al., Modeling of Quantization Effects in Digitally Controlled DC-DC Converters, IEEE Transactions on Power Electronics, vol. 22, No. 1, Jan. 2007.
H. Wu, et al., Single Phase Three-Level Power Factor Correction Circuit with Passive Lossless Snubber, IEEE Transactions on Power Electronics, vol. 17, No. 6, Nov. 2002.
Hattrup, et al., "Fast Estimation Techniques for Digital Control of Resonant Converters", IEEE Transactions on Power Electronics, Jan. 2003, p. 365-372, vol. 18, No. 1.
Hirota, Atsushi, et al., "Analysis of Single Switch Delta-Sigma Modulated Pulse Space Modulation PFC Converter Effectively Using Switching Power Device," IEEE, US, 2002.
Infineon, CCM-PFC Standalone Power Factor Correction (PFC) Controller in Continuous Conduction Mode (CCM), Version 2.1, Feb. 6, 2007.

International Rectifier, Application Note AN-1077,PFC Converter Design with IR1150 One Cycle Control IC, rev. 2.3, Jun. 2005.
International Rectifier, Data Sheet No. PD60230 revC, IR1150(S)(PbF), uPFC One Cycle Control PFC IC Feb. 5, 2007.
International Rectifier, Data Sheet PD60230 revC, Feb. 5, 2007.
International Rectifier, IRAC1150-300W Demo Board, User's Guide, Rev 3.0, Aug. 2, 2005.
Intersil, "Designing with the ISL6752, ISL6753 ZVS Full-Bridge Controllers," Application Note AN1262.0, Aug. 15, 2006.
Intersil, AN1262.0, "Designing with the ISL6752, ISL6753 ZVS Full-Bridge Controllers", Aug. 2006.
J. A. Vilela Jr., et al., An Electronic Ballast with High Power Factor and Low Voltage Stress, IEEE Transactions on Industry Applications, vol. 41, No. 4, Jul./Aug. 2005.
J. Qian, et al., Charge Pump Power-Factor-Correction Technologies Part II: Ballast Applications, IEEE Transactions on Power Electronics, vol. 15, No. 1, Jan. 2000.
J. Qian, et al., New Charge Pump Power-Factor-Correction Electronic Ballast with a Wide Range of Line Input Voltage, IEEE Transactions on Power Electronics, vol. 14, No. 1, Jan. 1999.
J. Turchi, Four Key Steps to Design a Continuous Conduction Mode PFC Stage Using the NCP1653, ON Semiconductor, Publication Order No. AND184/D, Nov. 2004.
J. Zhou, et al., Novel Sampling Algorithm for DSP Controlled 2 kW PFC Converter, IEEE Transactions on Power Electronics, vol. 16, No. 2, Mar. 2001.
J.W.F. Dorleijn, et al., Standardisation of the Static Resistances of Fluorescent Lamp Cathodes and New Data for Preheating, Industry Applications Conference, vol. 1, Oct. 13, 2002-Oct. 18, 2002.
K. Leung, et al., "Dynamic Hysteresis Band Control of the Buck Converter with Fast Transient Response," IEEE Transactions on Circuits and Systems—II: Express Briefs, vol. 52, No. 7, Jul. 2005.
K. Leung, et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.
K.M. Smedley, One-Cycle Control of Switching Converters, IEEE Transactions on Power Electronics, vol. 10, No. 6, Nov. 1995.
L. Balogh, et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.
L. Gonthier, et al., EN55015 Compliant 500W Dimmer with Low-Losses Symmetrical Switches, 2005 European Conference on Power Electronics and Applications, Sep. 2005.
Laouamri, et al., "Modeling and Analysis of Wound Integrated LCT Structure for Single Stage Resonant PFC Rectifier", IEEE Transactions on Power Electronics, Jan. 2003, p. 256-269, vol. 18, No. 1.
Light Dimmer Circuits, www.epanorama.net/documents/lights/lightdimmer.html, printed Mar. 26, 2007.
Light Emitting Diode, http://en.wikipedia.org/wiki/Light-emitting_diode, printed Mar. 27, 2007.
Lilei Gu, et al., "Three-Level LLC Series Resonant DC/DC Converter", IEEE Transactions on Power Electronics, Jul. 2005, p. 781-789, vol. 20, No. 4.
Lin, et al., "Robust Controller Design for a Series Resonant Converter via Duty-Cycle Control", IEEE Transactions on Power Electronics, Sep. 1999, p. 793-802, vol. 14 No. 5.
Linear Technology, "Single Switch PWM Controller with Auxiliary Boost Converter," LT1950 Datasheet, Linear Technology, Inc., Milpitas, CA, 2003.
Linear Technology, 100 Watt LED Driver, Linear Technology, 2006.
Linear Technology, LT1248, Power Factor Controller, Apr. 20, 2007.
Linear Technology, News Release,Triple Output LED, LT3496, Linear Technology, Milpitas, CA, May 24, 2007.
Linear Technology,"2-Switch Forward Controller and Gate Driver," LTC3705 Datasheet, Linear Technology, Inc., Milpitas, CA, 2005.
Lu, et al., International Rectifier, Bridgeless PFC Implementation Using One Cycle Control Technique, 2005.
Lu, et al., "Quasi Current Mode Control for the Phase-Shifted Series Resonant Converter," IEEE Transactions on Power Electronics, vol. 23, No. 1, p. 353-358, Jan. 2008.

M. Brkovic, et al., "Automatic Current Shaper with Fast Output Regulation and Soft-Switching," S.15.C Power Converters, Telecommunications Energy Conference, 1993.

M. K. Kazimierczuk, et al., Electronic Ballast for Fluorescent Lamps, IEEE Transactions on Power Electronics, vol. 8, No. 4, Oct. 1993.

M. Madigan, et al., Integrated High-Quality Rectifier-Regulators, IEEE Transactions on Industrial Electronics, vol. 46, No. 4, Aug. 1999.

M. Ponce, et al., High-Efficient Integrated Electronic Ballast for Compact Fluorescent Lamps, IEEE Transactions on Power Electronics, vol. 21, No. 2, Mar. 2006.

M. Radecker, et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades, et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Mammano, B., Resonant Mode Converter Topologies, Texas Instruments, 2001.

Mangat et al., "A Modified Asymmetrical Pulse-Width-Modulated Resonant DC/DC Converter Topology", IEEE Transactions on Power Electronics, Jan. 2004, p. 104-111, vol. 19, No. 1.

Megaman, D or S Dimming ESL, Product News, Mar. 15, 2007.

National Lighting, National Lighting Product Information Program, Specifier Reports, "Dimming Electronic Ballasts," vol. 7, No. 3, Oct. 1999.

Noon, Jim, "UC3855A/B High Performance Power Factor Preregulator", Texas Instruments, SLUA146A, May 1996,Revised Apr. 2004.

NXP, TEA1750, GreenChip III SMPS control IC Product Data Sheet, Apr. 6, 2007.

O. Garcia, et al., High Efficiency PFC Converter to Meet EN61000-3-2 and A14, Proceedings of the 2002 IEEE International Symposium on Industrial Electronics, vol. 3, 2002.

On Semconductor, NCP1606, Cost Effective Power Factor Controller, Mar. 2007.

On Semiconductor, AND8123/D, Power Factor Correction Stages Operating in Critical Conduction Mode, Sep. 2003.

On Semiconductor, MC33260, GreenLine Compact Power Factor Controller: Innovative Circuit for Cost Effective Solutions, Sep. 2005.

On Semiconductor, NCP1605, Enhanced, High Voltage and Efficient Standby Mode, Power Factor Controller, Feb. 2007.

On Semiconductor, NCP1654, Product Review, Power Factor Controller for Compact and Robust, Continuous Conduction Mode Pre-Converters, Mar. 2007.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

P. Lee, et al., Steady-State Analysis of an Interleaved Boost Converter with Coupled Inductors, IEEE Transactions on Industrial Electronics, vol. 47, No. 4, Aug. 2000.

Philips, Application Note, 90W Resonant SMPS with TEA1610 SwingChip, AN99011, 1999.

Power Integrations, Inc., "TOP200-4/14 TOPSwitch Family Three-terminal Off-line PWM Switch", XP-002524650, Jul. 1996, Sunnyvale, California.

Power Supply Design Tutorial, SMPS Block Diagram, Basic Concepts, Theory of Operation, http://www.smps.us/power-supply.html, printed Aug. 11, 2008.

Prodic, A., et al, "Dead Zone Digital Controller for Improved Dynamic Response of Power Factor Preregulators," IEEE, 2003.

Prodic, Aleksandar, "Digital Controller for High-Frequency Rectifiers with Power Factor Correction Suitable for On-Chip Implementation," IEEE, US, 2007.

Q. Li, et al., An Analysis of the ZVS Two-Inductor Boost Converter under Variable Frequency Operation, IEEE Transactions on Power Electronics, vol. 22, No. 1, Jan. 2007.

Renesas Technology Releases Industry's First Critical-Conduction-Mode Power Factor Correction Control IC Implementing Interleaved Operation, Dec. 18, 2006.

Renesas, Application Note R2A20111 EVB, PFC Control IC R2A20111 Evaluation Board, Feb. 2007.

Renesas, HA16174P/FP, Power Factor Correction Controller IC, Jan. 6, 2006.

S. Ben-Yaakov, et al., Statics and Dynamics of Fluorescent Lamps Operating at High Frequency: Modeling and Simulation, IEEE Transactions on Industry Applications, vol. 38, No. 6, Nov.-Dec. 2002.

S. Chan, et al., Design and Implementation of Dimmable Electronic Ballast Based on Integrated Inductor, IEEE Transactions on Power Electronics, vol. 22, No. 1, Jan. 2007.

S. Dunlap, et al., Design of Delta-Sigma Modulated Switching Power Supply, Circuits & Systems, Proceedings of the 1998 IEEE International Symposium, 1998.

S. Lee, et al., A Novel Electrode Power Profiler for Dimmable Ballasts Using DC Link Voltage and Switching Frequency Controls, IEEE Transactions on Power Electronics, vol. 19, No. 3, May 2004.

S. Lee, et al., TRIAC Dimmable Ballast with Power Equalization, IEEE Transactions on Power Electronics, vol. 20, No. 6, Nov. 2005.

S. Skogstad, et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

S. T.S. Lee, et al., Use of Saturable Inductor to Improve the Dimming Characteristics of Frequency-Controlled Dimmable Electronic Ballasts, IEEE Transactions on Power Electronics, vol. 19, No. 6, Nov. 2004.

S. Zhou, et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

Spiazzi G., et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.

ST Microelectronics, AN993, Application Note, Electronic Ballast with PFC Using L6574 and L6561, May 2004.

ST Microelectronics, L6574, CFL/TL Ballast Driver Preheat and Dimming, Sep. 2003.

ST Microelectronics, Power Factor Corrector L6561, Jun. 2004.

ST Microelectronics, L6563, Advanced Transition-Mode PFC Controller, Mar. 2007.

Supertex Inc., 56W Off-line LED Driver, 120VAC with PFC, 160V, 350mA Load, Dimmer Switch Compatible, DN-H05, Feb. 2007.

Supertex Inc., Buck-based LED Drivers Using the HV9910B, Application Note AN-H48, Dec. 28, 2007.

Supertex Inc., HV9931 Unity Power Factor LED Lamp Driver, Application Note AN-H52, Mar. 7, 2007.

T. Wu, et al., Single-Stage Electronic Ballast with Dimming Feature and Unity Power Factor, IEEE Transactions on Power Electronics, vol. 13, No. 3, May 1998.

Texas Instruments BiCMOS Advanced Phase-Shift PWM Controller Datasheet, Dec. 1999, Rev. Apr. 2008.

Texas Instruments, "BiCMOS Advanced Phase-Shift PWM Controller Datasheet," UCC1895, UCC2895, UCC3895, Dec. 1999, Rev. Apr. 2008.

Texas Instruments, Application Note SLUA321, Startup Current Transient of the Leading Edge Triggered PFC Controllers, Jul. 2004.

Texas Instruments, Application Report SLUA308, UCC3817 Current Sense Transformer Evaluation, Feb. 2004.

Texas Instruments, Application Report SLUA369B, 350-W, Two-Phase Interleaved PFC Pre-Regulator Design Review, Mar. 2007.

Texas Instruments, Application Report SPRA902A, Average Current Mode Controlled Power Factor Correctiom Converter using TMS320LF2407A, Jul. 2005.

Texas Instruments, Application Report, SLUA309A, Avoiding Audible Noise at Light Loads when using Leading Edge Triggered PFC Converters, Sep. 2004.

Texas Instruments, SLOS318F, "High-Speed, Low Noise, Fully-Differential I/O Amplifiers," THS4130 and THS4131, US, Jan. 2006.

Texas Instruments, SLUS828B, "8-Pin Continuous Conduction Mode (CCM) PFC Controller", UCC28019A, US, revised Apr. 2009.

Texas Instruments, Transition Mode PFC Controller, SLUS515D, Jul. 2005.

Texas Instruments, UCC3817 BiCMOS Power Factor Preregulator Evaluation Board User's Guide, Nov. 2002.

Tuomainen, et al., "Effect of Resonant Transition on Efficiency of Forward Converter with Active Clamp and Self-Driven SRs", IEEE Transactions on Power Electronics, Mar. 2005, p. 315-323, vol. 20, No. 2.

Unitrode Products From Texas Instruments, BiCMOS Power Factor Preregulator, Feb. 2006.

Unitrode Products From Texas Instruments, High Performance Power Factor Preregulator, Oct. 2005.

Unitrode Products From Texas Instruments, Programmable Output Power Factor Preregulator, Dec. 2004.

Unitrode, Design Note DN-39E, Optimizing Performance in UC3854 Power Factor Correction Applications, Nov. 1994.

Unitrode, High Power-Factor Preregulator, Oct. 1994.

Unitrode, L. Balogh, Design Note UC3854A/B and UC3855A/B Provide Power Limiting with Sinusoidal Input Current for PFC Front Ends, SLUA196A, Nov. 2001.

V. Nguyen, et al., "Tracking Control of Buck Converter Using Sliding-Mode with Adaptive Hysteresis," Power Electronics Specialists Conference, 1995. PESC apos; 95 Record., 26th Annual IEEE vol. 2, Issue, Jun. 18-22, 1995 pp. 1086-1093.

Vishwanathan, et al., "High Voltage DC Power Supply Topology for Pulsed Load Applications with Converter Switching Synchronized to Load Pulses," Power Electronics Group, Bangalore, India, Nov. 2003, vol. 1.

W. Zhang, et al., A New Duty Cycle Control Strategy for Power Factor Correction and FPGA Implementation, IEEE Transactions on Power Electronics, vol. 21, No. 6, Nov. 2006.

Why Different Dimming Ranges? The Difference Between Measured and Perceived Light, 2000 http://www.lutron.com/ballast/pdf/LutronBallastpg3.pdf.

Wong, et al., "Steady-state Analysis of Hysteretic Control Buck Converters", Power Electronics and Motion Control Conference, IEEE Press, New Jersey, Sep. 2008.

Xie, et al., "Analysis and Optimization of LLC Resonant Converter With a Novel Over-Current Protection Circuit", IEEE Transactions on Power Electronics, Mar. 2007, p. 435-443, vol. 22 No. 2.

Y. Ji, et al., Compatibility Testing of Fluorescent Lamp and Ballast Systems, IEEE Transactions on Industry Applications, vol. 35, No. 6, Nov./Dec. 1999.

Y. Ohno, Spectral Design Considerations for White LED Color Rendering, Final Manuscript, Optical Engineering, vol. 44, 111302 (2005).

Yan Lu, et al., "Quasi Current Mode Control for the Phase-Shifting Series Resonant Converter", IEEE Transactions on Power Electronics, Jan. 2008, p. 353-358, vol. 23 No. 1.

Ye, et al., "A Robust One-Cycle Controlled Full-Bridge Series-Parallel Resonant Inverter for a High Frequency AC (HFAC) Distribution System", IEEE Transactions on Power Electronics, Nov. 2007, p. 2331-2343, vol. 22, No. 6.

Z. Lai, et al., A Family of Power-Factor-Correction Controllers, Twelfth Annual Applied Power Electronics Conference and Exposition, vol. 1, Feb. 23, 1997-Feb. 27, 1997.

Zhao, et al., "Steady-state and Dynamic Analysis of a Buck Converter Using a Hysteretic PWM Control", Power Electronics Specialists Conference, IEEE Press, New Jersey, Jun. 2004.

Zie, et al., "Analysis and Optimization of LLC Resonant Converter with a Novel Over-Current Protection Circuit," IEEE Transactions on Power Electronics, vol. 22, No. 2, p. 435-443, Mar. 2007.

Office Action in U.S. Appl. No. 12/037,932 mailed on Feb. 19, 2010.

Notice of Allowance in U.S. Appl. No. 11/954,202 mailed on Nov. 9, 2009.

Maksimovic, et al., "Impact of Digital Control in Power Electronics", Proceedings of the 2004 International Symposium on Power Semiconductor Devices & ICs, pp. 13-22, Kitakyushu, JP, 2004.

L6562 Datasheet, "Transition-Mode PFC Controller", ST Microelectronics, Nov. 2005, Geneva, Switzerland.

Linear Technology LTC3705 Datasheet, 2005 Linear Technology, Inc.

Dunn, Jamie, "Determining MOSFET Driver Needs for Motor Drive Applications", AN-898 Application note, 2003, Microchip Technology.

HISTORY-INDEPENDENT NOISE-IMMUNE MODULATED TRANSFORMER-COUPLED GATE CONTROL SIGNALING METHOD AND APPARATUS

This Application is a Continuation-in-Part of U.S. patent application Ser. No. 11/954,202, filed on Dec. 11, 2007, now U.S. Pat No. 7,656,687 having at least one common inventor and assigned to the same Assignee, the disclosure of which is incorporated herein by reference.

BACKGROUND OF THE INVENTION

1. Field of the Invention

The present invention relates generally to power switching circuits having a transformer-coupled gate control, and more specifically, to a gate drive control circuit using a control signal modulated to a rate higher than the switching rate that encodes code sequence that indicate at least one switching time of the power switching circuits.

2. Background of the Invention

Transformer coupling of gate drive control is used in power switching circuits in which the transformer gate control signal either requires complete DC isolation from the switching control circuit, or in which the gate control voltage for at least one of the switching transistors is sufficiently high with respect to the controller integrated circuit operating voltage that transformer coupling of the gate control signal relaxes the voltage-handling requirements for the control circuit drive output(s). The transformer can also be used to step up a lower voltage switching signal, so that the higher voltage required to drive the gate of at least one of the transistors is easily generated from a lower-voltage source. Such a single-side transformer coupled circuit is shown in U.S. Pat. No. 7,078,963 to Andersen, et al, in which a transformer is used to couple the control circuit to the positive side switching transistor.

However, such implementations typically require a relatively large number of passive components to complete the circuit, such as resistors, capacitors and/or snubbing/protection diodes to ensure that the gate of the transistor that is coupled to the transformer secondary winding is not damaged or improperly controlled, and that the transformer does not saturate due to a net DC magnetization current from duty cycles other than 50%.

Solutions to the above, such as those disclosed in U.S. Pat. No. 5,206,540, either require driving multiple voltages to signal the isolated switching circuit to change the state of the power device gate control signal(s), or are subject to edge noise (spikes) that can mis-trigger the gate control signals. Synchronization is generally required, by constructing or supplying a reference clock signal to the isolated switching circuit, and such reference clock signal generation consumes power and requires additional circuitry.

Therefore, it would be desirable to provide a transformer-isolated gate drive circuit that requires few or no passive components to achieve a wide pulse width range and that provides robust and noise-immune operation. It would further be desirable to provide such a transformer-isolated gate drive circuit that does not require synchronization of the isolated gate drive circuit.

SUMMARY OF THE INVENTION

The above stated objective of providing a transformer-isolated gate drive circuit that requires few or no passive components to achieve a wide pulse width range with disable capability, provides robust and noise-immune operation without requiring a synchronization clock, is achieved in a gate drive control circuit and method of operation. The circuit may be provided by a transformer and a set of integrated circuits, one of which provides the control signal on the primary side of the transformer, and the other of which provides the gate drive signal from the secondary side of the transformer.

On the primary side of the transformer, a control circuit generates a modulated control signal that is coupled to the primary winding of the transformer. A demodulator is provided on the secondary side of the transformer and is coupled to a secondary winding to demodulate the control signal impressed by the control circuit on the primary winding. The modulated control signal is at a higher frequency than the actual gate control rate of the switching power stage, and uses relative edge timings within multiple periods of the modulated control signal to indicate events according to assigned codes. The codes include at least a turn-on event for specifying a turn-on time of the power switching transistor(s) according to a first assigned code. The demodulator turns on the gate of the power switching transistor(s) in response to detecting the turn-on event, and turns off the gate of the power switching transistor(s) in response to any unassigned other code sequence and may also turn-off the power switching transistors according to another code specifying a turn-off event. The modulation scheme is chosen to have a zero average DC voltage, so that no net magnetization current is generated in the transformer.

Blanking of the demodulator control can be provided after turn-on and/or turn-off events to improve noise immunity during switching events and to reduce power consumption. The blanking may be performed by stopping generation of the modulated control signal, ignoring the modulated control signal at the demodulator, or by encoding a blanking event according to a blanking code embedded in the modulated control signal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses circuits and methods for providing drive signal(s) that control the gate(s) of one or more switching devices of a switching power stage. A transformer is used to isolate at least one gate drive circuit from a controller integrated circuit, and the control signal is modulated at a rate substantially higher than the switching control rate of the switching power stage, e.g., by a factor of 10, which permits transmission of additional or redundant information and robust operation with few additional components. The above-incorporated Parent U.S. patent application Ser. No. 11/954,202, discloses and claims such modulated control schemes and circuits. However, the present invention provides further robustness and noise-immunity by introducing specific modulation schemes that uses codes indicated by relative timings of transitions of the modulated control signal, to effect control of the switching circuits. Blanking of the modulated control signal or blanking of the demodulated result may also be incorporated to provide further noise immunity, during and around switching events.

Figure 1A:
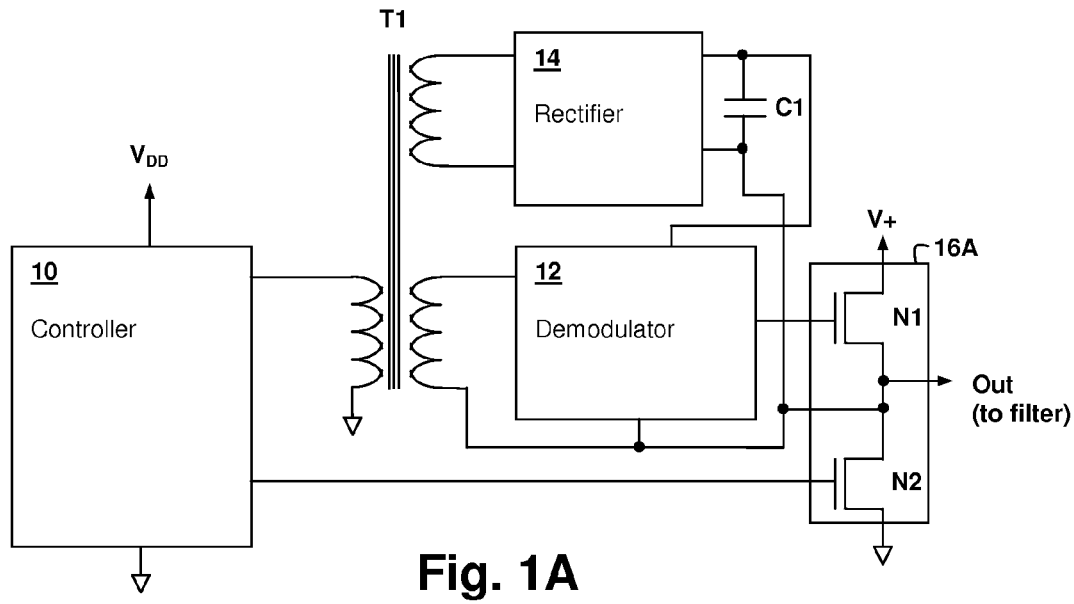
FIGS. 1A-1B are block diagrams depicting power switching circuits in accordance with embodiments of the present invention.

Referring now to FIG. 1A, a switching power circuit in accordance with an embodiment of the invention is shown. A controller 10, which may be a pulse-width modulator (PWM) including consecutive-edge modulators (CEMs) or other switching modulator type, such as a pulse frequency modulator (PFM), is coupled to a switching power stage 16A comprising power switching transistors N1 and N2. The gate of power switching transistor N1 is coupled to a controller circuit 10 by a transformer T1, and a demodulator 12 that decodes/demodulates gate control information present in a modulated control signal provided from controller 10 to a primary winding of transformer T1. The gate of power switching transistor N2 is coupled directly to controller 10 and is therefore provided at the switching control rate, rather than the modulated rate. A rectifier 14 is provided to generate a power supply voltage that is filtered by a capacitor C1, and supplied to demodulator 12. The negative rail of the output of rectifier 14 is connected to the drain of transistor N1, so that the gate control voltage generated by demodulator 12 "floats" to maintain the proper control voltage across the gate-drain terminals of transistor N1.

Figure 1B:
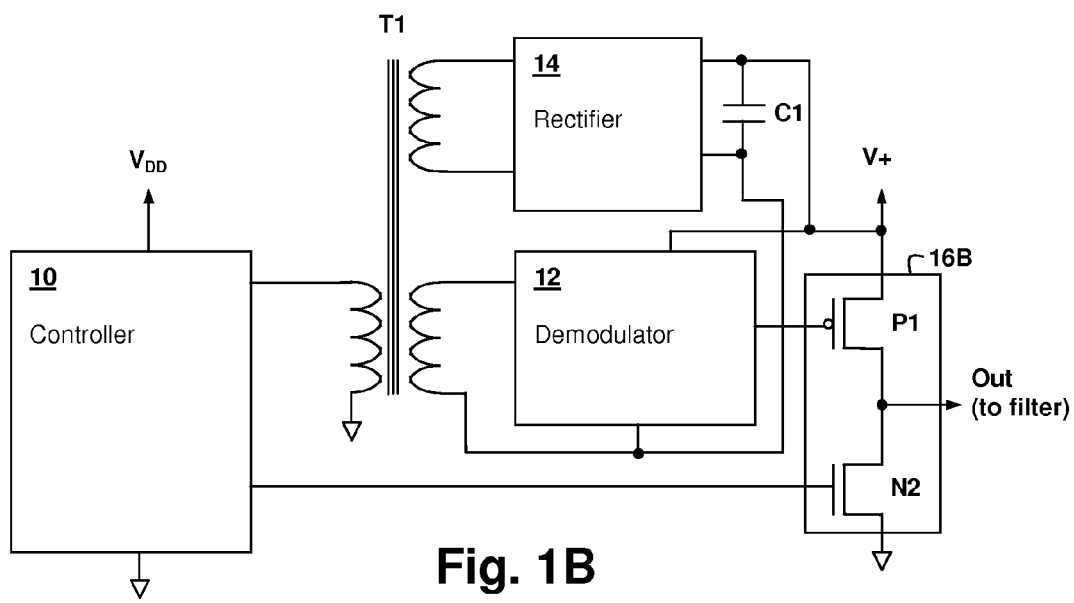

The circuit of FIG. 1A is isolated with respect to the output positive power supply rail and ground, so that controller 10 is not required to operate at the gate drive voltage that is needed to turn on power switching transistor N1 under all operating conditions. Further, by operating demodulator 12 with a power supply voltage that is generated by rectifier 14 and floated above the drain voltage of power switching transistor N1, low-voltage circuits can be used to implement demodulator 12 and rectifier 14, even if power supply voltage V+ is a relatively high voltage. The circuit of FIG. 1B is similar to the circuit of FIG. 1A, except that a P-channel transistor P1 is substituted for the positive-rail switch to form a switching power stage 16B. In the circuit of FIG. 1B, a high positive gate voltage is needed to completely turn off the P-channel transistor P1 under all operating conditions. Therefore, the positive output of rectifier 14 is referenced to the positive output power supply rail, so that a low-voltage supplied from rectifier 14 to demodulator 12 is sufficient to turn on transistor P1 when required and transistor P1 will be turned completely off when the output of demodulator 12 is set to voltage V+. The partially-isolated circuits of FIGS. 1A-1B are particularly applicable in applications such as switching power audio amplifiers and DC-DC converters. However, the techniques of the present invention may also be used to provide a fully-isolated switching power stage.

Figure 2A:
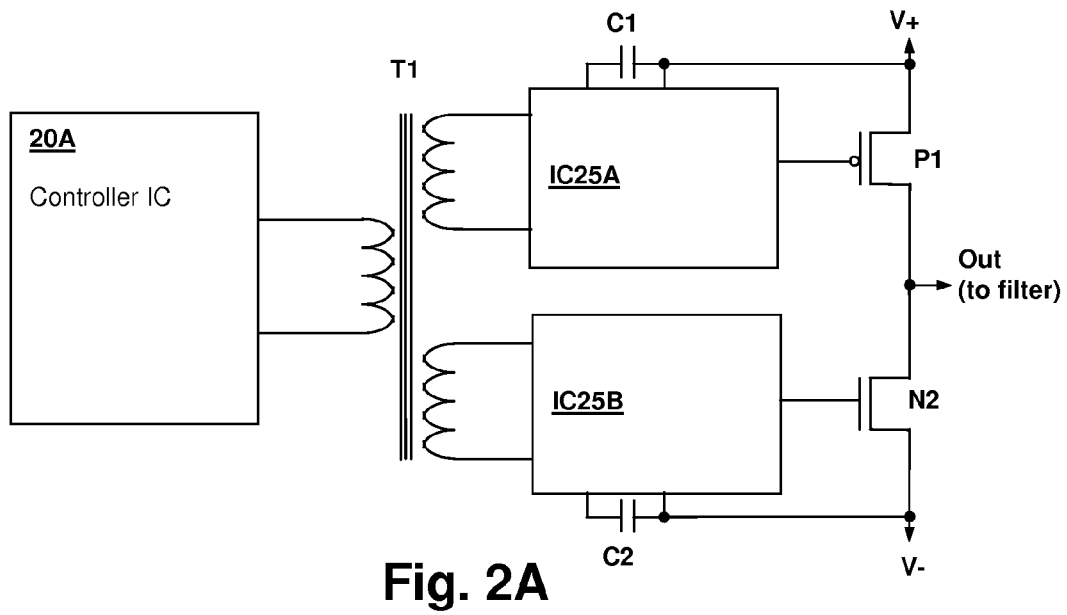
FIGS. 2A-2B are block diagrams depicting power switching circuits in accordance with other embodiments of the present invention.

Referring now to FIG. 2A, a switching power circuit in accordance with another embodiment of the invention is shown. The depicted embodiment fully isolates a controller IC 20A from the switching power stage using transformer T1. Demodulator integrated circuits IC25A and IC25B provide the gate control signals to transistors P1 and N2, respectively. As in the circuit of FIG. 1B, demodulator integrated circuit IC25A is referenced to the output positive power supply rail, and similarly, demodulator integrated circuit IC25B is referenced to the output negative power supply rail, so that both demodulator integrated circuits IC25A and IC25B can be implemented in low-voltage technology. The modulated control signal provided by controller IC 20A to transformer T1 has information that may be coded separately for demodulator integrated circuit IC25A and demodulator integrated circuit IC25B, for example, specific codes for specifying the on-time and off-time of transistors P1 and N2, or other codes indicating that one or both of transistors P1 and N2 should be disabled or constantly enabled (100% duty-cycle) or codes that introduce an offset from the indicated switching time for one or both of transistors P1 and N2. Capacitors C1 and C2 filter the outputs of rectifier circuits included in demodulator integrated circuits IC25A and IC25B, which are derived from the same windings as the modulated control signal. In the depicted embodiment, a single modulated control signal encodes the switching information needed to control both switching power transistors P1 and N2. However, separate modulated control signals may be provided to separate transformers coupling controller integrated circuit 20A to demodulator integrated circuits IC25A and IC25B.

Figure 2B:
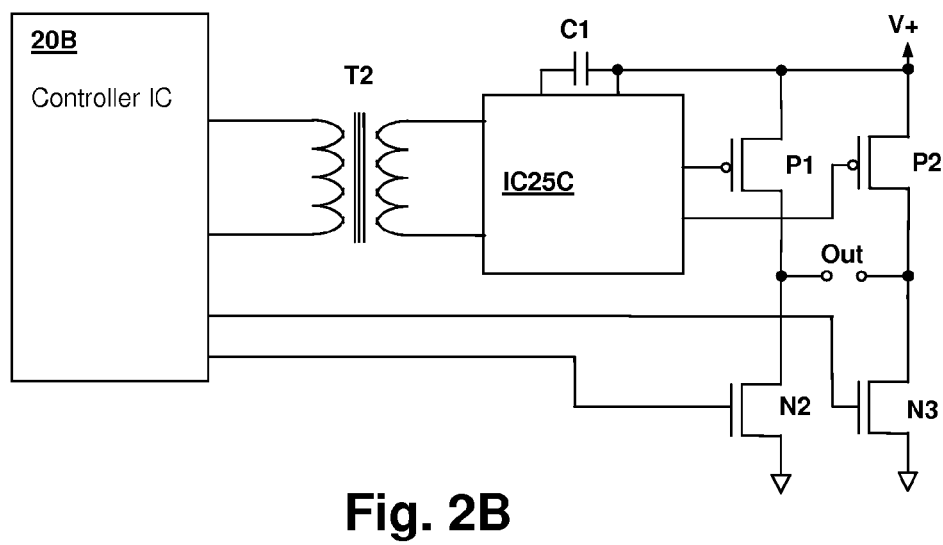

FIG. 2B illustrates a power switching circuit in accordance with yet another embodiment of the present invention. In the embodiment of FIG. 2B, a full-bridge switching circuit is implemented by transistor pairs P1,N2 and P2-N3. As in the circuit of FIG. 1B, only the P-channel (positive rail) switching transistors are isolated and controlled by the modulated control signal. Demodulator integrated circuit IC25C provides control of both power switching transistor P1 and P2, by decoding control information coupled through transformer T2, while power switching transistors N2 and N3 are controlled directly from controller integrated circuit 20B. Capacitor C1 filters the rectifier output of demodulator integrated circuit IC25C, which is referenced to the output positive power supply rail V+.

Figure 3:
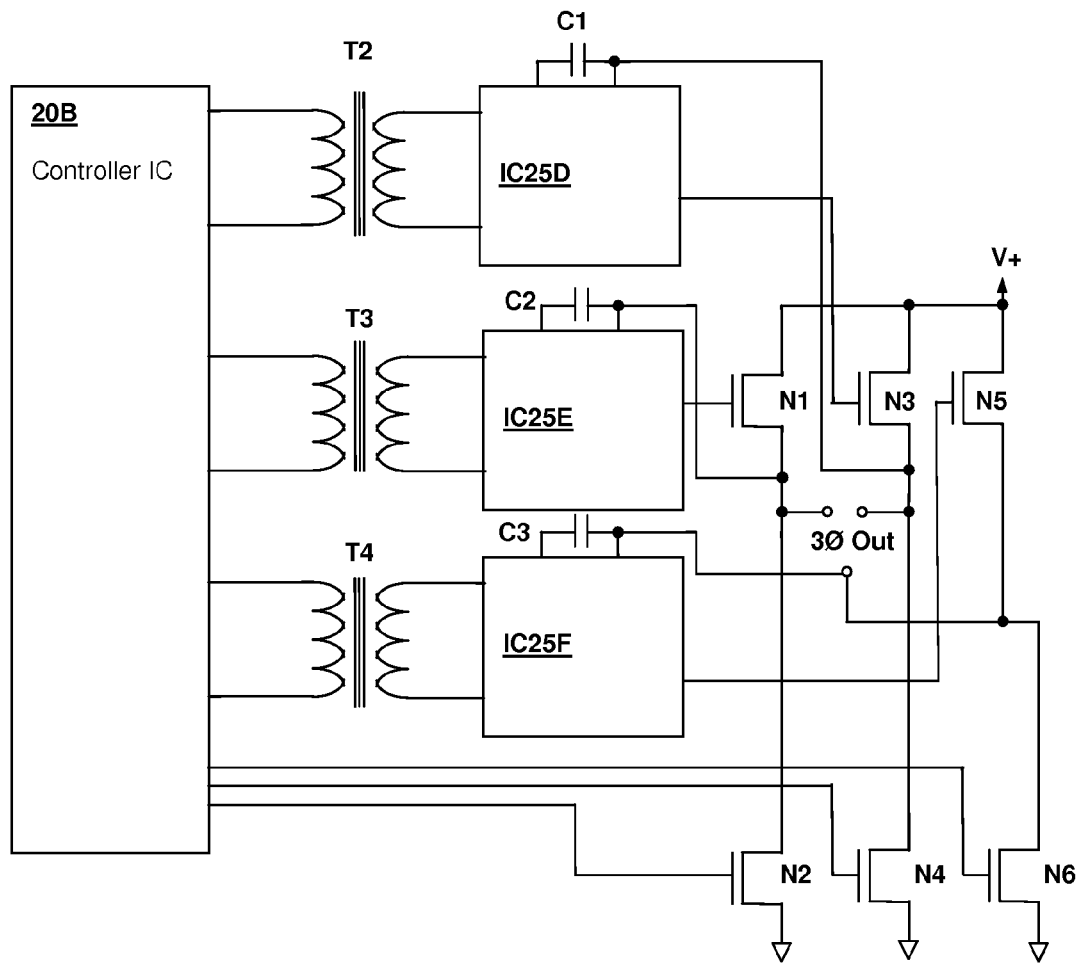
FIG. 3 is a block diagram depicting a power switching circuit in accordance with yet another embodiment of the present invention.

Referring now to FIG. 3, a power switching circuit in accordance with yet another embodiment of the present invention is shown. In the embodiment of FIG. 3, a three-phase switching circuit is implemented by transistor pairs N1-N2, N3-N4 and N5-N6. As in the circuits of FIG. 2A and FIG. 2B, only the P-channel (positive rail) switching transistors are isolated and controlled by the modulated control signals, which are provided by independent transformers T2-T4. Three demodulator integrated circuits IC25D-IC25F provide independent control and biasing of power switching transistors N1, N3 and N5, respectively, by decoding control information coupled through corresponding transformers T2-T4. Power switching transistors N2, N4 and N6 are controlled directly from controller integrated circuit 20B. Capacitors C1-C3 filter the rectifier outputs of demodulator integrated circuits IC25D-IC25F, which are independently referenced to the drain of corresponding power switching transistors N1, N3 and N5, respectively. The embodiment of FIG. 3 thus provides for the use of N-channel devices in a three-phase control application, while maintaining low voltage gate control requirements for each of power switching transistors N1, N3 and N5. One transformer, demodulator circuit and switching transistor pair can be removed to provide a similar full-bridge configuration.

Figure 4:
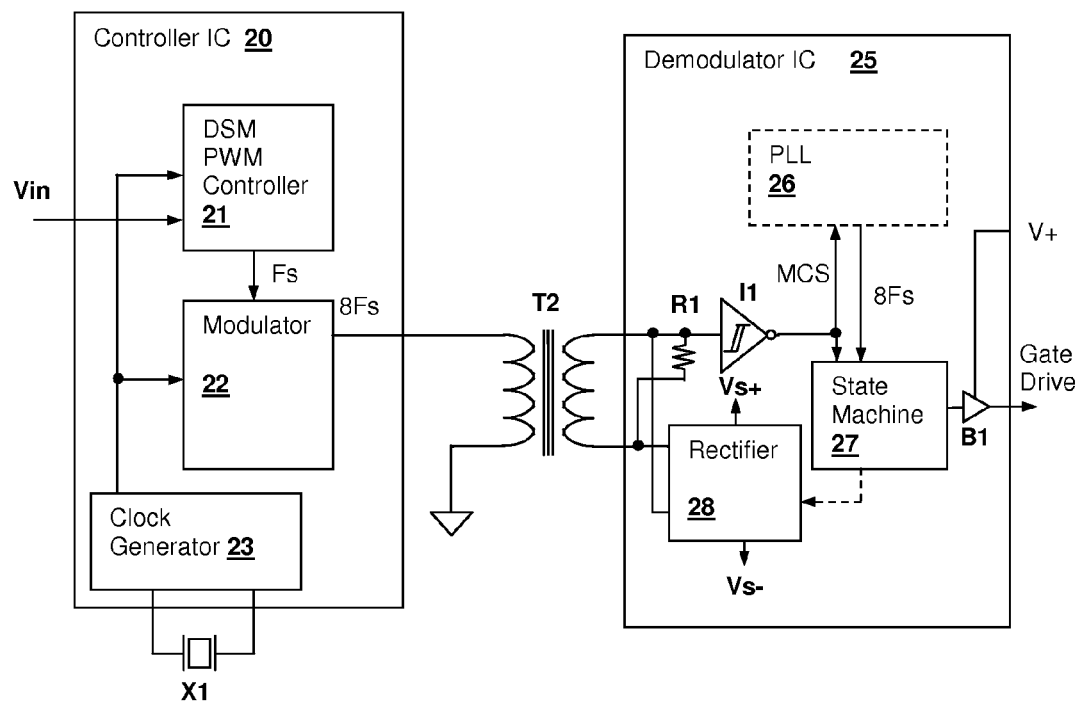
FIG. 4 is a block diagram depicting a power switching circuit in accordance with still another embodiment of the present invention.

Referring now to FIG. 4, a switching power circuit in accordance with still another embodiment of the invention is shown. The illustrated embodiment discloses structural details of demodulator IC 25 and controller IC 20 that may be used in the above-described embodiment illustrated in FIGS. 1A-3. The embodiment of FIG. 4 illustrates a "two-chip" solution with little or no external components required, other than transformer T2 and the power switching transistor(s). Other packaging arrangements are possible, including single IC and discrete/multi-IC implementations and are contemplated by the present invention. Therefore, the implementation illustrated in FIG. 4 is illustrative of only one possible device packaging arrangement and is not limiting as to the scope of the invention. A crystal X1, is shown connected to controller IC 20 to provide a reference for internal clock generator 23, but an internal clock circuit may alternatively be used, further reducing external component requirements. Further, because the modulation techniques of the present invention are not state history dependent due to the use of specific code sequences and modulation schemes for which the code values are determined from relative edge (transition) positions, synchronization clock requirements are relaxed over those required for purely frequency modulated (FM) or phase modulated (PM) control signals. Controller IC 20 receives an input signal Vin and converts the voltage of the input signal to a pulse width modulated signal using a delta-sigma modulator (DSM) based pulse width modulator (PWM) controller 21 at the switching frequency Fs. A modulator 22 converts the output of DSM PWM controller 21 to a higher rate, illustrated as 8Fs, which is provided to the primary winding of transformer T2.

In practice, the modulating function in controller IC 20 will generally be performed by the same logic that generates the pulse width modulated control information, and extra information can be inserted, for example to control two switching transistors as illustrated in FIG. 2B, or to provide extra control information to control transistor gate compensation circuits, or perform other control operations. Redundant information can also be provided, for example, the simplified illustrated example provides 8 cycles of control signal for each switching period, which may encode 8 or more bits of information used to signal the actual switching times.

Demodulator IC 25 includes a rectifier 28, which may be a passive rectifier such as a bridge that supplies power supply voltages Vs+ and Vs−. Alternatively, rectifier 28 may be a switched rectifier that receives a control signal from state machine 27 so that the polarity of the rectification is controlled according to the expected polarity of modulated control signal MCS. Modulated control signal is extracted from the secondary winding of transformer T2 by a circuit including load resistor R1 and Schmitt inverter I1. A phase-locked loop (PLL) 26 may optionally be included to provide a clock reference at 8Fs to state machine 27, but is not required for decoding the modulated control signals of the present invention as will be illustrated in further detail below. Other reference clock generator circuits, such as delay-locked loops (DLLs), may be also alternatively employed. State machine 27 decodes information in modulated control signal MCS to provide a gate drive signal input to buffer B1, which has an output operated from the switching power stage positive power supply rail, which is generally a higher voltage than power supply rail Vs+. The decoding detects the turn-on event code embedded in the modulated control signal, and state machine 27 turns on the gate control signal(s) in response to the turn-on event. As described in detail below, a turn-off code may be used to specify a turn-off event, and state machine 27 turns off the gate control signal(s) in response thereto. A detection error (code not recognized or unassigned) will generally cause a turn-off of all switching transistors, in order to protect the power converter and any connected devices. State machine 27 may also detect a specific blanking code or a blanking condition and ignore subsequent detected codes for a time interval, leaving the gate control signals in their current state. Alternatively, the blanking event may be used to turn off the gate control signal, in which case the gate on event is sent continuously until the blanking event is sent to indicate a turn-off event.

Figure 5A:
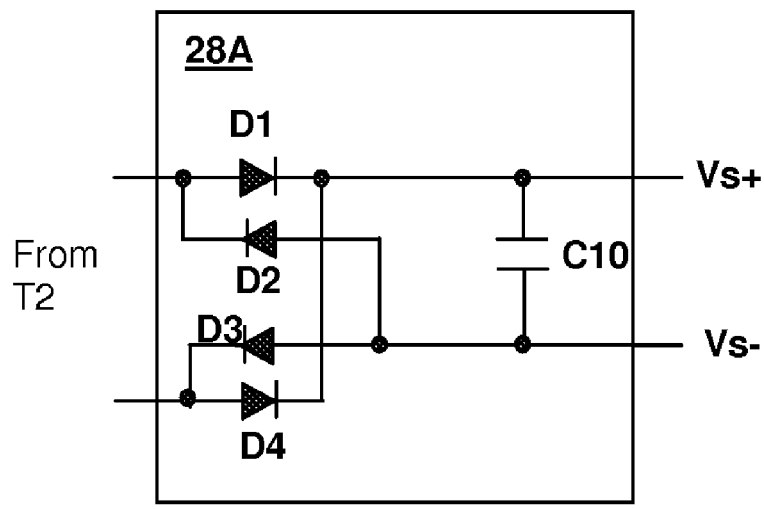
FIGS. 5A-5B are schematic diagrams showing rectifier circuits that may be used to implement rectifier circuits 14 and 28 of FIG. 4.

Referring now to FIG. 5A, a rectifier circuit 28A that may be used to implement rectifier circuit 14 of FIG. 1A and FIG. 1B and rectifier circuit 28 of FIG. 4 is shown. Diodes D1-D4 form a full-wave bridge and capacitor C10 filters the rectified modulated control signal to provide DC power supply outputs Vs+ and Vs−. Capacitor C10 may be provided external to the integrated circuit package that includes the demodulator and rectifier circuits.

Figure 5B:
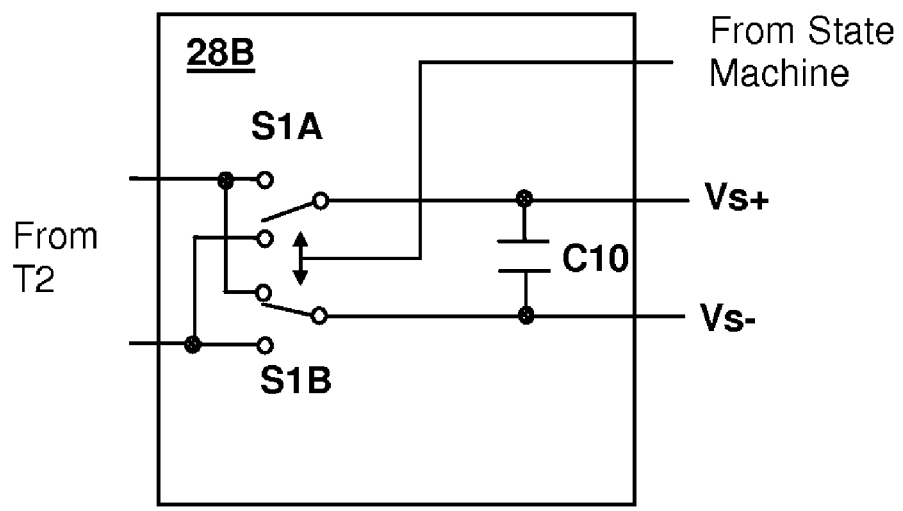

Referring now to FIG. 5B, a rectifier circuit 28B that may be used to implement rectifier circuit 28 of FIG. 4 is shown. Switches S1A and S1B are controlled by a signal provided from state machine 27 to control the rectification polarity according to the expected (or actual detected) polarity of modulated control signal MCS. Capacitor C10 filters the output of switches S1A and S1B to provide DC power supply outputs Vs+ and Vs−.

Figure 6A:
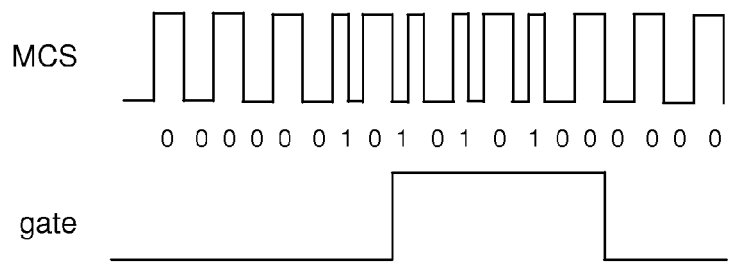
FIGS. 6A-6D are signal waveform diagrams depicting signals within the circuits depicted in FIGS. 1A-4 having differing modulation schemes in accordance with embodiments of the present invention.
Figure 6B:
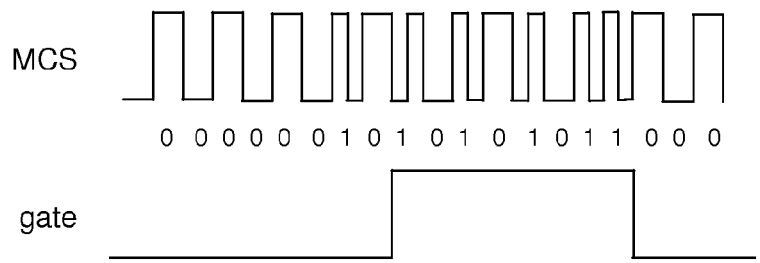

Referring now to FIGS. 6A-6B, signal waveform diagrams are shown that illustrate operation of the above-described modulated control scheme, in accordance with an embodiment of the present invention. FIG. 6A illustrates a modulation scheme that uses a transition within a half-period of the basic (longer) period of modulation control signal MCS to signal a binary "1" value and the absence of such a transition to signal a binary "0" value. Thus, the relative timing of the edge transitions in the modulation control signal MCS encode a binary stream. While the specific embodiment illustrated in FIG. 6A uses binary encoding, ternary or higher-order encodings may be employed in other embodiments of the present invention. Further, as will be illustrated below, a blanking state may be included to save power by turning the modulated control signal "off", and information can also be obtained from the off state. FIG. 6A also illustrates a particular coding scheme for the binary stream, which is used to signal turn-on and turn-off events that signals the demodulator and associated control circuits to turn a power switching transistor on and off. A "turn-off event" code of all zeros is assigned to set gate control signal gate to a state, illustrated as a low voltage level, which will turn the corresponding power switching transistor off. A "turn-on event" code of alternating ones and zeros is assigned to set gate control signal gate to a higher voltage value, turning the corresponding power switching transistor on. The code for turn-on can be quite long, increasing the robustness of the circuit, which is highly desirable, as the turn-on of a power switching transistor at an improper time can lead to catastrophic failure of the switching converter and connected devices. As illustrated in FIG. 6A, two consecutive zero values are detected before the decision is made (e.g., by state machine 27 in FIG. 4 above) to change the state of gate control signal gate. FIG. 6B illustrates the same modulation and encoding scheme, in which the transition to a "turn-off" state occurs when the binary stream is in the "1" state, requiring detection of two consecutive one values to enable the decision to turn the transistor off. Detection of any other pattern that is unassigned (e.g., an unassigned code) will also cause the demodulator to turn the transistor off. As can be observed from modulation control signal MCS, since the relative timing between the edges is at a 2:1 ratio, minor variations in the frequency will not disrupt operation, and can be used advantageously (e.g., by PWM controller 21 of FIG. 4) to position the transitions of gate control signal gate. Further, as mentioned above, a PLL or other reference clock generator is not required to decode modulation control signal MCS, as the timing detection can be performed by a timing reference having a stability and accuracy sufficient to distinguish the 2:1 period ratio with some confidence, such as a capacitor-based ramp circuit.

Figure 6C:
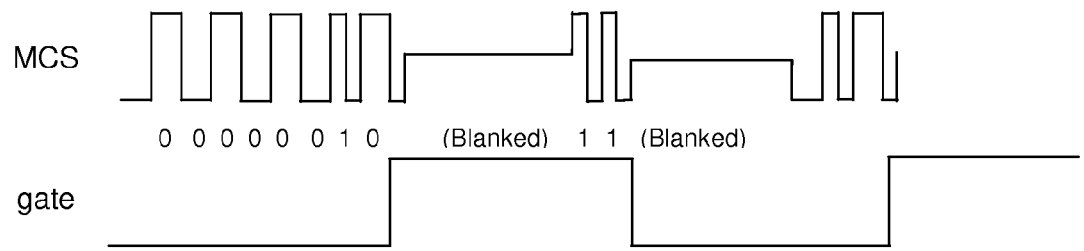

FIG. 6C illustrates another modulation scheme employing blanking to avoid mis-triggering due to noise generated by the power switching action of the circuits described above. An alternating pattern, as illustrated in FIG. 6A and FIG. 6B, is again used to signal the on state of gate control signal gate, but after the first alternation event, the signal is blanked. As mentioned above, the blanking can be performed by the modulator circuit, which can short the windings of the transformer, or blanking can be determined by a time interval or count of periods during which the demodulator ignores the transitions of modulation control signal MCS. Alternatively, a "blanking event" code can be used to indicate the beginning of a blanking interval. Blanking further reduces the power consumption of the modulator and/or the demodulator by reducing the transitions that are generated and detected.

Figure 6D:
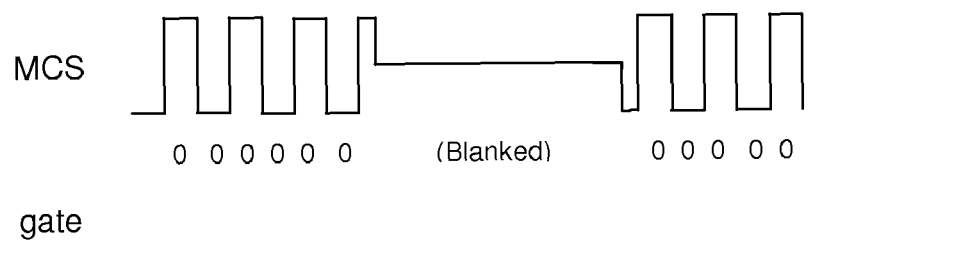

FIG. 6D illustrates a blanking event not associated with a turn-on or turn-off event in a modulation scheme according to another embodiment of the present invention. The negative half-pulse occurring at the end of the blanking event cancels the transformer magnetization due to the positive half-pulse, so that such a blanking event can be inserted at any time in the modulated control signal when no other events are to be inserted to reduce power consumption. The primary (controller side) of the transformer is shorted during the blanking interval or otherwise held at a zero potential. The blanking event can also be detected by the demodulator and used to ignore the modulation control signal, further improving noise immunity.

Figure 7:
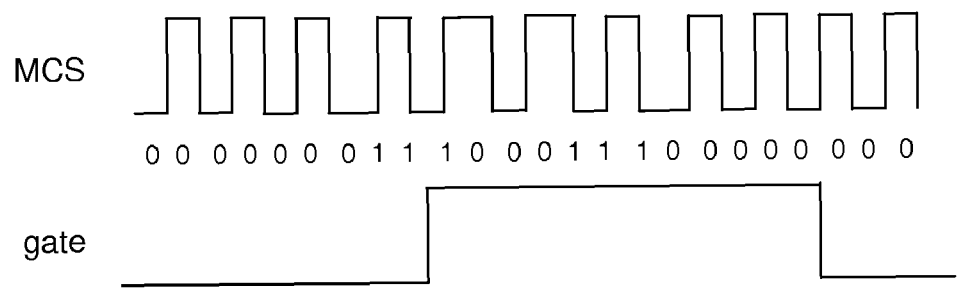
FIG. 7 is a signal waveform diagram depicting signals within the circuits depicted in FIGS. 1A-4 having a modified-FM (MFM) modulation scheme in accordance with another embodiment of the present invention.

FIG. 7 illustrates a modulation and encoding scheme in accordance with another embodiment of the present invention. In FIG. 7, modulation control signal MCS is a modified-FM (MFM) signal, that reduces the overall number of transitions required to transmit the turn-on event and turn-off event codes. In the depicted modulation control scheme, a sequence of 111000111000 . . . indicates the turn-on event and a sequence of 00000 is treated as a turn-off event. A reference clock is generally needed to decode MFM, unlike the scheme illustrated above, because the positions of the edge transitions of modulation control signal MCS determine whether a "1" bit is present. When a shift of a quarter period occurs as illustrated in modulation control signal MCS of FIG. 7 the edge transitions are now centered in the half-periods defined by the previous waveform defining the 00000 . . . bitstream and the value of "1" is transmitted. When the edge position shifts back, the value binary value returns to zero.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit, comprising:
a switching power stage for producing a switched power output at a switching rate and having at least one power switching transistor;
a switching control circuit for determining a turn-on time and a turn-off time of the at least one power switching transistor at the switching rate, and having an output for providing a modulated control signal having a modulated rate that is greater than the switching rate, wherein the modulated control signal encodes events according to codes specified by relative timing of transitions of the modulated control signal in multiple periods of the modulated control signal, the events including a turn-on event corresponding to the turn-on time of the at least one power switching transistor;
a transformer for coupling the output of the switching control circuit to the at least one power switching transistor, whereby the at least one power switching transistor has a gate that is DC isolated from the switching control circuit, wherein a first winding of the transformer is connected to the switching control circuit; and
a demodulator circuit connected to at least one second winding of the transformer and having an output coupled to the gate of the at least one power switching transistor, wherein the output of the demodulator is a gate control signal generated at the switching rate from a control signal received from the at least one second winding at the modulated rate, and wherein the demodulator asserts the gate control signal upon detection of the turn-on event and de-asserts the gate control signal upon detection of another code.

2. The circuit of claim 1, wherein the modulated control signal encodes a binary stream and wherein the codes are specified by patterns of the binary stream.

3. The circuit of claim 2, wherein a particular state of the binary stream is indicated by at least two transitions of the modulated control signal within a half-period of the modulated rate.

4. The circuit of claim 2, wherein the turn-on event is encoded by an alternating pattern of zero and one values of the binary stream.

5. The circuit of claim 4, wherein the another code includes a turn-off code specifying a turn-off event, wherein the demodulator de-asserts the gate control signal upon detection of the turn-off code, wherein the turn-on event is encoded by an alternating pattern of zero and one values and the turn-off event is encoded by two or more adjacent zero or one values.

6. The circuit of claim 1, wherein the another code includes a turn-off code specifying a turn-off event, and wherein the demodulator de-asserts the gate control signal upon detection of the turn-off code.

7. The circuit of claim 6, wherein the switching control circuit does not generate transitions of the modulated control signal in blanking periods extending after codes corresponding to the turn-on event and the turn-off event.

8. The circuit of claim 1, wherein the switching control circuit de-asserts the gate control signal upon detection of an unassigned or unrecognizable code.

9. The circuit of claim 1, wherein the demodulator circuit does not change the gate control signal during blanking periods extending after detection of turn-on events.

10. The circuit of claim 1, wherein the switching control circuit does not generate transitions of the modulated control signal for a blanking period extending after codes corresponding to the turn-on event.

11. The circuit of claim 1, wherein the events include a blanking event, wherein the demodulator circuit does not change the gate control signal during blanking periods extending after detection of a code corresponding to the blanking event.

12. A circuit, comprising:
a switching power stage for producing a switched power output at a switching rate and having at least one power switching transistor;
a switching control circuit for determining a turn-on time and a turn-off time of the at least one power switching transistor at the switching rate, and having an output for providing a modulated control signal having a modulated rate that is greater than the switching rate, and wherein the switching control circuit encodes one or more event types according to relative timing between transitions of the modulated control signal, the event types including a turn-on event that indicates the turn-on time of the at least one power switching transistor, and wherein the switching control circuit stops the transitions of the modulated control signal to conserve power between events;
a transformer for coupling the output of the switching control circuit to the at least one power switching transistor, whereby the at least one transistor has a gate that is DC isolated from the switching control circuit, wherein a first winding of the transformer is connected to the switching control circuit; and
a demodulator circuit connected to at least one second winding of the transformer and having an output coupled to the gate of the at least one power switching transistor, wherein the output of the demodulator is a gate control signal generated at the switching rate from a control signal received from the at least one second winding at the modulated rate, and wherein the demodulator asserts the gate control signal upon detection of the turn-on event within the modulated control signal.

13. A method for controlling a switching power stage, comprising:
generating a modulated control signal for controlling a turn-on time and a turn-off time of at least one power switching transistor of the switching power stage at a switching rate of the switching power stage, wherein the modulated control signal is generated at a modulated rate greater than the switching rate of the switching power stage, rate, wherein the modulated control signal encodes events according to codes specified by relative timing of transitions of the modulated control signal in multiple periods of the modulated control signal, the events including a turn-on event corresponding to the turn-on time of the at least one power switching transistor;
transformer isolating the modulated control signal to provide a DC isolated control signal to at least one power switching transistor of the switching power stage;
demodulating the DC isolated control signal from the modulated rate to control the at least one power switching transistor at the switching rate; and
controlling a gate of the at least one power switching transistor in conformity with a result of the demodulating, wherein the at least one power switching transistor is turned on upon detection of the turn-on event, and wherein the at least one power switching transistor is turned off upon detection of another code.

14. The method of claim 13, wherein the modulated control signal encodes a binary stream and wherein the codes are specified by patterns of the binary stream.

15. The method of claim 14, wherein a particular state of the binary stream is indicated by at least two transitions of the modulated control signal within a half-period of the modulated rate.

16. The method of claim 13, wherein the turn-on event is encoded by an alternating pattern of zero and one values of the binary stream.

17. The method of claim 16, wherein the another code includes a turn-off code specifying a turn-off event, wherein the controlling de-asserts the gate control signal upon detection of the turn-off code by the demodulating, wherein the turn-on event is encoded by an alternating pattern of zero and one values and the turn-off event is encoded by two or more adjacent zero or one values.

18. The method of 13, wherein the another code includes a turn-off code specifying a turn-off event, and wherein the controlling de-asserts the gate control signal upon detection of the turn-off code by the demodulating.

19. The method of claim 18, wherein the generating does not generate transitions of the modulated control signal in blanking periods extending after codes corresponding to the turn-on event and the turn-off event.

20. The method of claim 13, wherein the controlling de-asserts the gate control signal upon detection of an unassigned or unrecognizable code by the demodulating.

21. The method of claim 13, wherein the controlling does not change the gate control signal during blanking periods extending after detection of turn-on events by the demodulating.

22. The method of claim 13, wherein the generating does not generate transitions of the modulated control signal for a blanking period extending after codes corresponding to the turn-on event.

23. The method of claim 13, wherein the events include a blanking event, wherein the controlling does not change the gate control signal during blanking periods extending after detection of a code corresponding to the blanking event by the demodulating.

24. A method for controlling a switching power stage, comprising:
generating a modulated control signal for controlling a turn-on time and a turn-off time of a transistor of the switching power stage at a switching rate of the switching power stage, wherein the modulated control signal is generated at a modulated rate greater than the switching rate of the switching power stage, wherein the generating encodes one or more event types specified by relative timing between transitions of the modulated control signal, the event types including a turn-on event that indicates the turn-on time of the transistor, and wherein the generating stops generating the transitions of the modulated control signal to conserve power between events;
transformer isolating the modulated control signal to provide a DC isolated control signal to at least one power switching transistor of the switching power stage;
demodulating the DC isolated control signal from the modulated rate to control the at least one power switching transistor at the switching rate; and
controlling a gate of the at least one power switching transistor in conformity with a result of the demodulating, wherein the demodulator asserts the gate control signal upon detection of the turn-on event within the modulated control signal.

25. An integrated circuit, comprising:
a pair of terminals for connection to an output winding of a transformer having a modulated control signal imposed from an input winding carrying information for controlling a switching power stage, wherein the switching power stage produces a switched power output at a switching rate and includes at least one power switching transistor, wherein the modulated control signal is generated at a modulated rate greater than the switching rate of the switching power stage, wherein the modulated control signal encodes events according to codes specified by relative timing of transitions of the modulated control signal in multiple periods of the modulated control signal, the events including turn-on event corresponding to the turn-on time of the at least one power switching transistor; and a demodulator circuit having inputs coupled to the pair of terminals and having an output coupled to a driver circuit for controlling the gate of the at least one power switching transistor, wherein the output of the demodulator is a gate control signal generated at the switching rate from a signal received by the pair of terminals from the output winding that contains the information at the modulated rate, and wherein the demodulator asserts the gate control signal upon detection of the turn-on event and de-asserts the gate control signal upon detection of another code.

26. An integrated circuit, comprising:

a pair of terminals for connection to an input winding of a transformer for imposing a control signal carrying information for controlling a switching power stage coupled to an output winding of the transformer, wherein the switching power stage produces a switched power output at a switching rate and includes at least one power switching transistor, and wherein the control signal carries said information at a modulated rate that is greater than the switching rate; and a switching control circuit having an output coupled to at least one of the pair of terminals for determining a turn-on time and a turn-off time of the at least one power switching transistor and generating the control signal at a modulated rate that is greater than the switching rate, wherein the modulated control signal encodes events according to codes specified by relative timing of transitions of the modulated control signal in multiple periods of the modulated control signal, the events including a turn-on event corresponding to the turn-on time of the at least one power switching transistor.

* * * * *